(12) United States Patent
Kim et al.

(10) Patent No.: US 12,289,835 B2
(45) Date of Patent: Apr. 29, 2025

(54) SUBSTRATE MODULE AND POWER MODULE FOR TRANSFORMER

(71) Applicant: LG INNOTEK CO., LTD., Seoul (KR)

(72) Inventors: Soo San Kim, Seoul (KR); Sung June Park, Seoul (KR); Yong Seok Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 186 days.

(21) Appl. No.: 17/790,564

(22) PCT Filed: Jan. 5, 2021

(86) PCT No.: PCT/KR2021/000085
§ 371 (c)(1),
(2) Date: Jul. 1, 2022

(87) PCT Pub. No.: WO2021/141360
PCT Pub. Date: Jul. 15, 2021

(65) Prior Publication Data
US 2023/0040151 A1    Feb. 9, 2023

(30) Foreign Application Priority Data

Jan. 9, 2020   (KR) ................. 10-2020-0003196

(51) Int. Cl.
*H05K 1/18* (2006.01)
*H01F 27/06* (2006.01)
(Continued)

(52) U.S. Cl.
CPC ............ *H05K 1/189* (2013.01); *H01F 27/06* (2013.01); *H01L 25/072* (2013.01);
(Continued)

(58) Field of Classification Search
CPC ............... H05K 1/0209; H05K 1/0233; H05K 1/0263; H05K 1/0278; H05K 1/141;
(Continued)

(56) References Cited

U.S. PATENT DOCUMENTS

| | | | | |
|---|---|---|---|---|
| 4,872,102 A * | 10/1989 | Getter | ................. | H02M 7/003 361/709 |
| 5,321,380 A * | 6/1994 | Godek | ................. | H01F 27/027 336/200 |
| 5,565,837 A * | 10/1996 | Godek | ................. | H01F 17/0006 336/200 |
| 2003/0186674 A1* | 10/2003 | Keeney | ................. | H05K 1/165 29/831 |
| 2005/0041400 A1* | 2/2005 | Berberich | ................. | H05K 1/162 361/803 |
| 2005/0270745 A1* | 12/2005 | Chen | ................. | H01F 27/2804 361/707 |

(Continued)

FOREIGN PATENT DOCUMENTS

| | | |
|---|---|---|
| JP | 2008-502293 A | 1/2008 |
| JP | 2011-181570 A | 9/2011 |

(Continued)

*Primary Examiner* — Amir A Jalali
(74) *Attorney, Agent, or Firm* — Birch, Stewart, Kolasch & Birch, LLP

(57) ABSTRACT

A substrate module according to an embodiment of the present invention comprises: a first substrate which includes transformer connection part to be connected to terminals of a transformer, at least one second substrate on which a switch module to be connected to the transformer is formed; and a conductive connector which connects the first substrate and the second substrate to each other, wherein the first substrate and the second substrate are arranged by the conductive connector such that a predetermined angle is formed therebetween.

15 Claims, 16 Drawing Sheets

1200

(51) Int. Cl.
*H01L 25/07* (2006.01)
*H05K 1/02* (2006.01)

(52) U.S. Cl.
CPC ......... *H05K 1/0209* (2013.01); *H05K 1/0278* (2013.01); *H01F 2027/065* (2013.01); *H05K 2201/056* (2013.01); *H05K 2201/1003* (2013.01); *H05K 2201/10166* (2013.01); *H05K 2201/10522* (2013.01); *H05K 2201/10545* (2013.01); *H05K 2201/10901* (2013.01)

(58) Field of Classification Search
CPC .......... H05K 1/18; H05K 1/181; H05K 1/184; H05K 1/189; H05K 3/366; H05K 2201/056; H05K 2201/1005; H05K 2201/10166; H05K 2201/10272; H05K 2201/10522; H05K 2201/10545; H05K 2201/10901; H01F 27/24; H01F 27/28; H01F 27/292; H01L 25/072; H02M 7/003
See application file for complete search history.

(56) References Cited

U.S. PATENT DOCUMENTS

| | | | |
|---|---|---|---|
| 2006/0049777 | A1 | 3/2006 | Kumagai et al. |
| 2010/0188830 | A1* | 7/2010 | Tsai .................. H01F 27/2847 |
| | | | 361/782 |
| 2011/0140823 | A1 | 6/2011 | Lin et al. |
| 2013/0188329 | A1 | 7/2013 | Chang et al. |
| 2014/0307391 | A1* | 10/2014 | Standing ................. H05K 3/30 |
| | | | 29/829 |
| 2017/0148565 | A1 | 5/2017 | Zhang et al. |
| 2018/0084646 | A1* | 3/2018 | Purohit ............... H05K 5/0073 |
| 2019/0140551 | A1 | 5/2019 | Lu et al. |
| 2022/0037074 | A1* | 2/2022 | Tashiro ............ H02M 3/33576 |

FOREIGN PATENT DOCUMENTS

| | | |
|---|---|---|
| JP | 2018-157027 A | 10/2018 |
| KR | 10-0762300 B1 | 10/2007 |
| KR | 10-2016-0106367 A | 9/2016 |
| WO | WO 2015/196972 A1 | 12/2015 |

\* cited by examiner

SUBSTRATE MODULE AND POWER MODULE FOR TRANSFORMER

CROSS REFERENCE TO RELATED APPLICATIONS

This application is the National Phase of PCT International Application No. PCT/KR2021/000085, filed on Jan. 5, 2021, which claims priority under 35 U.S.C. 119 (a) to Patent Application No. 10-2020-0003196, filed in the Republic of Korea on Jan. 9, 2020, all of which are hereby expressly incorporated by reference into the present application.

TECHNICAL FIELD

The present invention relates to a substrate module for a transformer, and more particularly, the present invention relates to a substrate module, mounted on a transformer, applying a voltage or current to the transformer, formed of substrates for controlling the input of voltage or current, and a power module including the same.

BACKGROUND ART

A data center refers to a building or facility that provides server computers and network lines and the like. It is also referred to as a server hotel. Data centers began to grow explosively with the spread of the Internet. As thousands or tens of thousands of server computers are needed to store and display vast amounts of information such as Internet searches, shopping, games, and education on websites, an Internet data center was established to gather these server computers in one place and manage them stably. A data center of a telecommunication company is referred to as an Internet data center (IDC), and a data center for cloud services is referred to as a cloud data center, however, these days, the distinction between these terms has almost disappeared, and the term data center is being used in a unified way.

For a data center to provide uninterrupted service 24 hours a day, 365 days a year, stable power supply, internet connection, and security are important. Internet data centers are mainly installed in multi-story high-rise buildings, wherein a cage is installed for each user group on each floor, several racks are installed in it, and then a switch is placed in each rack to connect several server computers. In addition, a constant temperature and humidity device is installed and operated to maintain a constant temperature and humidity, such as a large-capacity cooling device to cool the heat emitted from the server computers.

For reliable power supply to the data center, a power supply unit (PSU) is also provided as a power module, and various studies for realizing a circuit having a high power density are being conducted. In order to suffice high power density, various new technologies such as power semiconductors and devices are being reviewed, and products are implemented in module form to realize high power density with scalability.

DETAILED DESCRIPTION OF THE INVENTION

Technical Subject

The technical problem to be solved by the present invention is to provide a substrate module for a transformer and a power module including the same, which is mounted on a transformer, applies a voltage or current to the transformer, and is formed of substrates for controlling the input of voltage or current.

The problems of the present invention are not limited to the problems mentioned above, and other problems not mentioned will be clearly understood by those skilled in the art from the following description.

Technical Solution

In order to solve the above technical problem, a substrate module according to an embodiment of the present invention comprises: a first substrate which includes a transformer connection part to be connected to terminals of a transformer; at least one second substrate on which a switch module to be connected to the transformer is formed; and a conductive connector which connects the first substrate and the second substrate to each other, wherein the first substrate and the second substrate are arranged by the conductive connector such that a predetermined angle is formed therebetween.

In addition, the transformer connection part may be connected to the terminals of the secondary coil of the transformer.

In addition, the first substrate may include an inductor connection part to be connected to the terminals of a secondary-side inductor disposed on one side of the transformer.

In addition, the transformer connection part may be formed of a plurality of holes connected to the plurality of terminals of the transformer, and the inductor connection part may be formed of a plurality of holes connected to the terminals of the secondary-side inductor.

In addition, the first substrate may include a busbar connecting the transformer connection part and the conductive connector, and the inductor connection part and the conductive connector.

In addition, the switch module may include a plurality of FET modules disposed on a first surface of the second substrate and a control module disposed on a second surface of the second substrate to control the plurality of FET modules.

In addition, a heat dissipation part for dissipating heat generated by the switch module to the outside may be disposed on a second surface of the second substrate.

In addition, the first substrate is located on an upper surface of the transformer; the second substrate includes a second-first substrate and a second-second substrate spaced apart from the second-first substrate; and the second-first substrate and the second-second substrate are connected at one end forming a predetermined angle on both sides of the first substrate, and the other end may be connected to the main substrate located on a lower surface of the transformer.

In addition, a third substrate on which a switch module connected to the primary coil of the transformer is formed; and the third substrate may be connected to the second substrate.

In order to solve the above technical problem, a power module according to an embodiment of the present invention includes: a transformer; and a substrate module including a switch module connected to the primary coil or the secondary coil of the transformer to input or to receive output a voltage or current, and to control the input and output of the voltage or current, wherein the substrate module includes: a first substrate on which a transformer connection part being connected to the terminals of the transformer is formed; and one or more second substrates on which a switch module for controlling the transformer is formed, and wherein the first substrate and the second substrate are connected by forming a predetermined angle with a conductive connector that is processed to be bendable.

Advantageous Effects

According to embodiments of the present invention, it is possible to replace a large number of busbars with the PCB substrate module, thereby reducing the number of man-hours, which is advantageous in terms of process. In addition, the number of soldering can be reduced, and the contact resistance can be reduced. In addition, existing elements can be integrated on the PCB substrate, reducing the number of man-hours required to receive and insert each heat sink, and heat dissipation can be improved by eliminating blocking of the air flow of the fan by the heat sink. Furthermore, it is possible to increase the degree of integration to increase the scalability of space utilization.

The effect according to the present invention is not limited by the contents exemplified above, and more various effects are included in the present specification.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under) ", the meaning of not only an upward direction but also a downward direction based on one component may be included.

Figure 1:
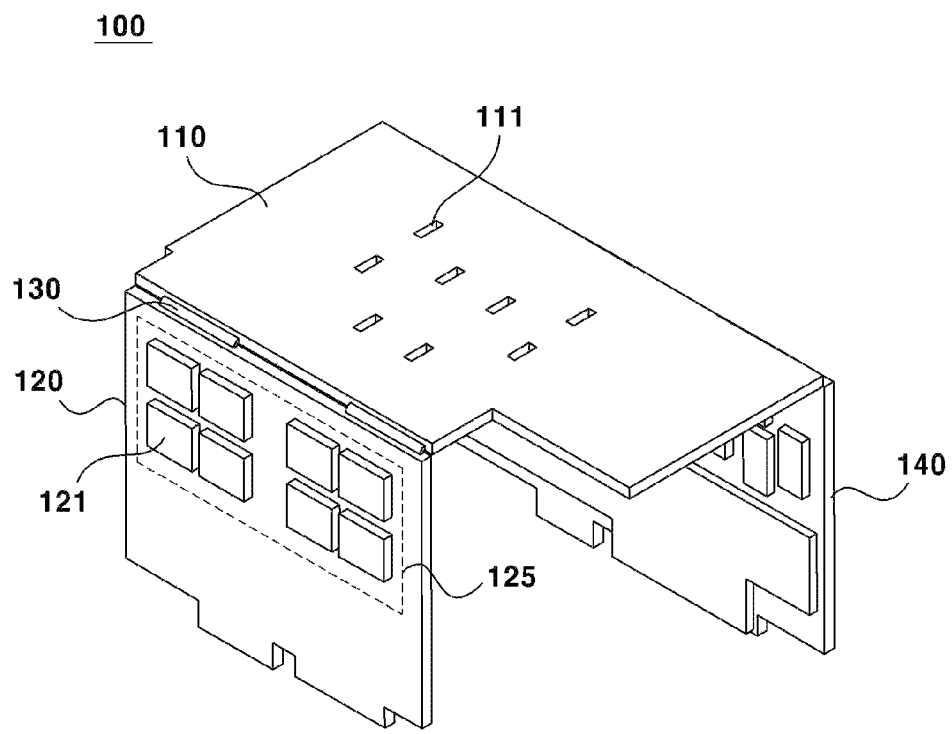
FIG. 1 is a perspective view of a substrate module for a transformer according to an embodiment of the present invention.

FIG. 1 is a perspective view of a substrate module for a transformer according to an embodiment of the present invention.

The substrate module 100 for a transformer according to an embodiment of the present invention comprises a first substrate 110 and second substrates 120 and 140 connected to a conductive connector 130, or the second substrates 120 and 140 may comprise only one of the first-second substrate 120 or the second-second substrate 140.

The substrate module 100 for a transformer according to an embodiment of the present invention includes a switch module mounted on a transformer 210 to input or output a voltage or current to the transformer 210, and to control the input and output of the voltage or current. Here, the transformer 210 is a device for outputting a required voltage by reducing or boosting the input voltage, and the transformer 210 in a power module receives a voltage from an external power source such as a battery, transforms the voltage into a voltage required for a device requiring power, and outputs the voltage. At this time, the transformer 210 may be an inverter that converts direct current into alternating current, or a converter that converts direct current into direct current or converts alternating current into direct current. In addition, it may be a transformer 210 in which the voltage inputted to the transformer 210 is inputted in multi-phase by a switch. For example, it may be a phase shift full bridge (PSFB) transformer. In the case of a PSFB transformer, a plurality of switches forming a bridge circuit is required so that voltages having different phases can be inputted. The PSFB transformer has a constant duty ratio, and the output voltage can be adjusted according to how much the phase is pushed or pulled. That is, it is possible to control the output voltage of the transformer by controlling the phase of each bridge circuit. The primary coil 211 and the secondary coil 212 forming the transformer 210 may be formed with a predetermined number of turns of coils or a predetermined number of coils according to the turn ratio. The primary coil 211 and the secondary coil 212 may be formed to be insulated from each other.

The first substrate 110 may include a transformer connection part 111 connected to the terminals of the transformer 210. In addition, the busbar 112 of FIG. 2 may be formed on the first substrate 110, or the first substrate 110 may further include an inductor connection part 113 of FIG. 3.

More specifically, the first substrate 110 may include a transformer connection part 111 and may be connected to the transformer 210 through the transformer connection part 111. The transformer connection part 111 may be formed of a plurality of holes connected to a plurality of terminals of the transformer 210 as shown in FIG. 1. A plurality of terminals of each transformer 210 may be inserted into the plurality of holes, and the terminals of the transformer 210 may be coupled to each other by soldering the first substrate 110. The number of holes of the transformer connection part 111 may vary according to the number of terminals of the transformer 210 to be connected to the first substrate 110. In addition, the hole of the transformer connection part 111 is formed to correspond to the shape and position of the terminals of the transformer 210.

The transformer connection part 111 may be connected to the terminals of the secondary coil 212 of the transformer 210. The transformer 210 is formed of a primary coil 211 and a secondary coil 212, and the primary coil 211 of the transformer 210 is connected to the main substrate to receive voltage or current, and the secondary coil 212 of the transformer 210 may be connected to the transformer connection part 111 of the first substrate 110. The secondary coil 212 of the transformer 210 may be formed of two coils connected in parallel, and each coil may be formed of a plurality of coils according to a turn ratio. At this time, the secondary coil 212 of the transformer 210 may be formed only in the form of one loop, not the form that is wound several times. In a corresponding configuration, if two turns are required to implement a turn ratio, two coils may be connected in series to implement a turn ratio of two turns. That is, when two coils are to be wound according to the turn ratio of the secondary coil 212, the two coils are connected in series to form one coil set implementing the corresponding turn ratio, and when coils are configured in parallel to increase capacity, two sets of coils can be connected in parallel. In this case, a total of four coils are required, and in order to connect the four coils in series or in parallel, two terminals are needed for each coil. That is, the transformer connection part 111 may be formed with a total of 8 holes. In addition, the position of the hole according to the shape and position of the terminal of the secondary coil 212 of the transformer 210 may be formed at a different position for each coil, as shown in FIG. 1. The two holes forming a pair to be connected to the two terminals of each coil may be formed not to be in line with each other, or may be formed on the same line.

Figure 2:
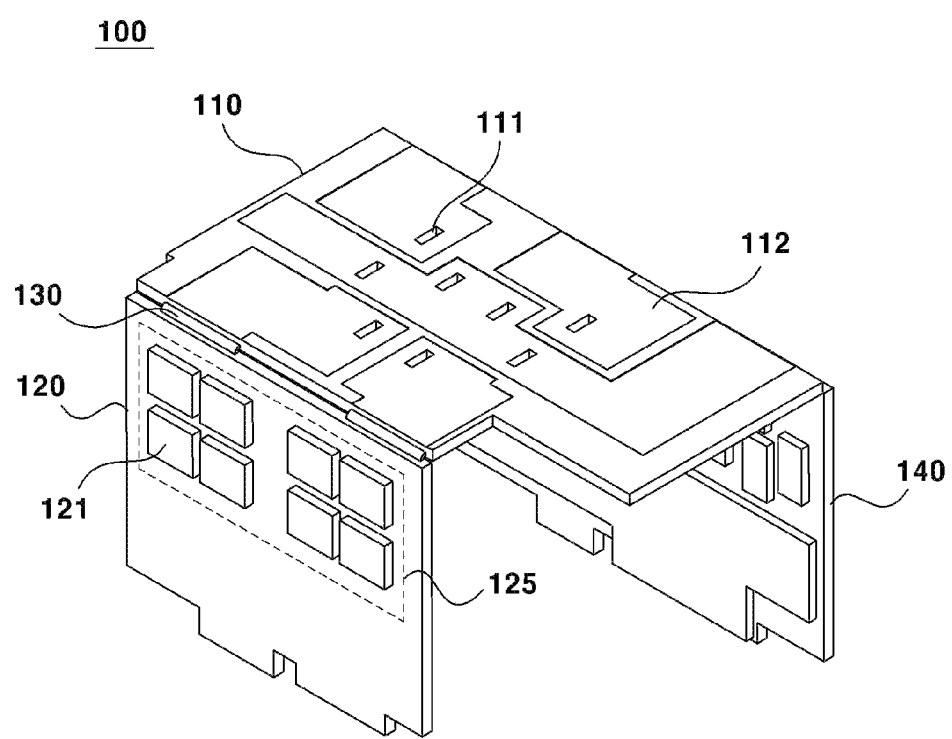
FIGS. 2 and 3 are perspective views of a substrate module for a transformer according to another embodiment of the present invention.

A busbar 112 being connected to the transformer connection part 111 may be formed on the first substrate 110. The transformer connection part 111 must be connected to a power line so that voltage or current can be applied or applied through the transformer connection part 111. A busbar 112 is formed on the first substrate 110, and power may be applied to the transformer connection part 111 through the busbar 112. The busbar 112 may be formed of a conductive material such as a copper plate inside the first substrate 110. The busbar 112 is a conductor that performs an electrical connection. A large current may flow by using the busbar 112. A plurality of terminals of the transformer 210 should be connected to each other or insulated according to the connection relationship of the coils. Accordingly, the busbar 112 formed on the first substrate 110 may be formed to electrically connect the connection terminals connected to the transformer connection part 111 to each other or to be electrically insulated from each other according to the connection relationship of each coil. The busbar 112 may be formed in various shapes according to design, and may be formed inside the first substrate 110 according to the design. As shown in FIG. 2, the busbar 112 may be formed according to a connection relationship between terminals. Terminals connected to each other may be formed to be connected together to one busbar 112, and terminals not connected to each other may be formed to be connected to a busbar 112 that is insulated from another busbar 112. For insulation between busbars 112, they may be spaced apart by a predetermined distance between the busbars 112. The busbars 112 that are insulated from each other may be spaced apart by a distance required for insulation according to the magnitude of the current flowing through the busbars 112. Each busbar 112 may be connected to the second substrates 120 and 140, and may be connected to a power line through the second substrates 120 and 140. Each busbar 112 may be connected to switch modules 125 and 145 formed on the second substrates 120 and 140. The second substrates 120 and 140 may be connected to a main substrate including a power line, and the first substrate 110 may receive power through the second substrates 120 and 140. Or, the first substrate 110 may be directly connected to the power line or may be connected to the main substrate.

Figure 3:
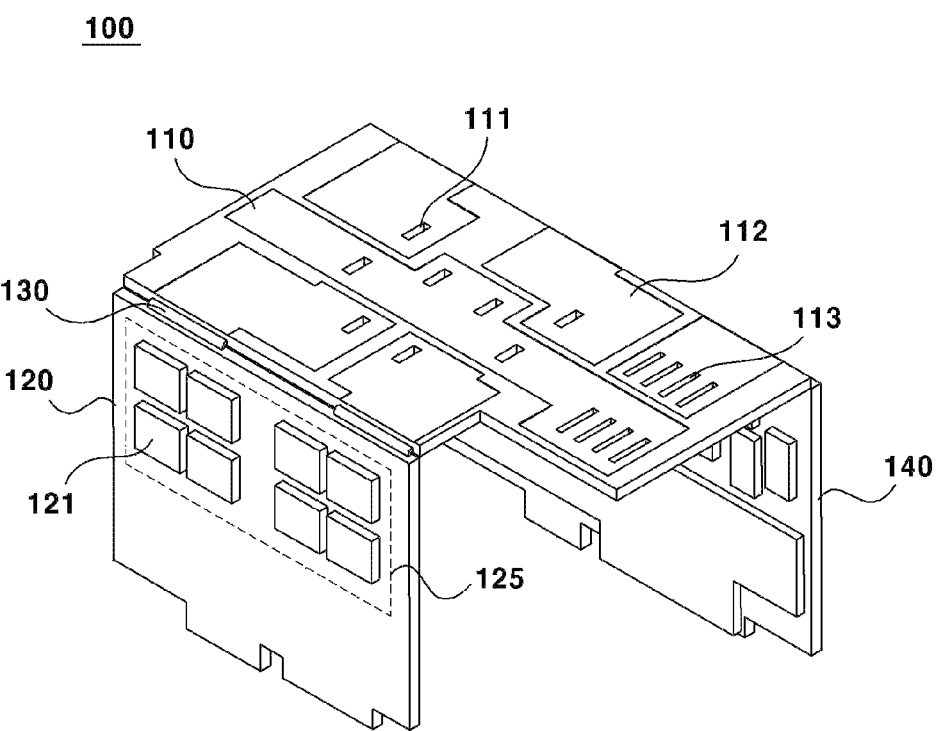

The first substrate 110 may include an inductor connection part 113 connected to the terminals 231 of the secondary-side inductor 230. In order to increase the stability of the circuit in the transformer 210, a secondary-side inductor 230 or a primary-side inductor 220 may be additionally disposed. The secondary-side inductor 230 may be connected to the output terminals of the secondary coil 212. When the secondary-side inductor 230 is added to the transformer 210, the first substrate 110 may include an inductor connection part 113 connected to the terminals of the secondary-side inductor 230. As shown in FIG. 3, as many inductor connection parts 113 as the number of terminals of the secondary-side inductor 230 may be formed. For example, when the secondary-side inductor 230 is formed of four coils to form a total of eight terminals, each of which is two input/output terminals, the inductor connection part 113 may also be formed with eight holes. The terminals of the secondary-side inductor 230 may be coupled to the inductor connection part 113 by soldering while the terminals of the secondary-side inductor 230 are inserted into the plurality of holes of the inductor connection part 113. Since the secondary-side inductor is connected to the output terminals of the secondary coil 212 of the transformer 210, the transformer connection part 111 corresponding to the output terminals of the secondary coil 212 of the transformer 210 may be connected together to the busbar 112 to which they are connected. The corresponding busbar 112 may be electrically connected to the second-second substrate 140 through the secondary-side inductor 230. Since the main substrate of the secondary-side inductor 230 is connected through the second-second substrate 140 through the busbar 112 formed on the first substrate 110, a separate connection line to the main substrate of the secondary-side inductor 230 is not required, thereby facilitating the use of space.

The busbar 112 being connected to the input terminals of each coil and the busbar 112 being connected to the output terminals can be formed to be insulated from each other so as to be connected to the second-second substrate 140 through the secondary-side inductor 230. Through this, the output terminals of the secondary coil 212 may be connected to the second-second substrate 140 through the secondary-side inductor 230.

Switch modules 125 and 145 being connected to the transformer 210 are formed on the second substrates 120 and 140.

More specifically, switch modules 125 and 145 for controlling the voltage or current outputted from the transformer 210 or applied to the transformer 210 are formed on the first-second substrate 120 and 140. At this time, the second substrates 120 and 140 comprise only one of the first-second substrate 120 or the second-second substrate 140, or may be formed to have both the first-second substrate 120 and the second-second substrate 140. Or, it may be formed of three or more substrates. When formed of one substrate, the switch modules 125 and 145 being connected to the transformer 210 may all be formed on one substrate, and when formed of a plurality of substrates, a plurality of switch modules 125 and 145 being connected to the transformer 210 may be divided and formed on a plurality of substrates. The switch modules 125 and 145 may be secondary-side switch modules of the PSFB.

The switch modules 125 and 145 may be connected to the secondary coil 212 of the transformer 210 and formed as many as the number of modules to be controlled. That is, the switches necessary for the circuit to be implemented through the transformer 210 may be formed as the switch modules 125 and 145 on the second substrates 120 and 140.

The switch modules 125 and 145 may be formed of a surface mounted device (SMD). A surface mount device is a device mounted on a substrate, and the device can be mounted on one or both sides of a printed circuit substrate using surface mount technology (SMT), thereby enabling high-density mounting. The switch modules 125 and 145 may be formed in the form of surface mount devices on the second substrates 120 and 140 as shown in FIG. 1. Through this, a heat sink for implementing each switch element is removed and directly soldered on a substrate to have a high heat dissipation effect, and a more compact module can be implemented. In the case of coupling to a heat sink, materials such as screws and insulating paper are required, and there is a high probability of occurrence of defects, however, when formed in the form of a surface mount device, the process can be simplified and the probability of defects can be reduced. In addition, it is easy to expand according to capacity and size. For example, it is easy to additionally connect an FET, which is a switching device, in parallel or add a leg.

The switch modules 125 and 145 may be formed of a plurality of FET modules 121 and 141 and control modules 122 and 142 for controlling the plurality of FET modules. The switch modules 125 and 145 may be formed of the FET modules 121 and 141 that are switching elements, and the control modules 122 and 142 that control the on/off operation of each FET module. At this time, the control modules 122 and 142 may be formed of a driver module. At this time, one switching element may be formed of one or more FET modules 121 and 141. One switching element may be formed using the plurality of FET modules 121 and 141 according to the capacity of the FET for the switching operation.

Figure 4:
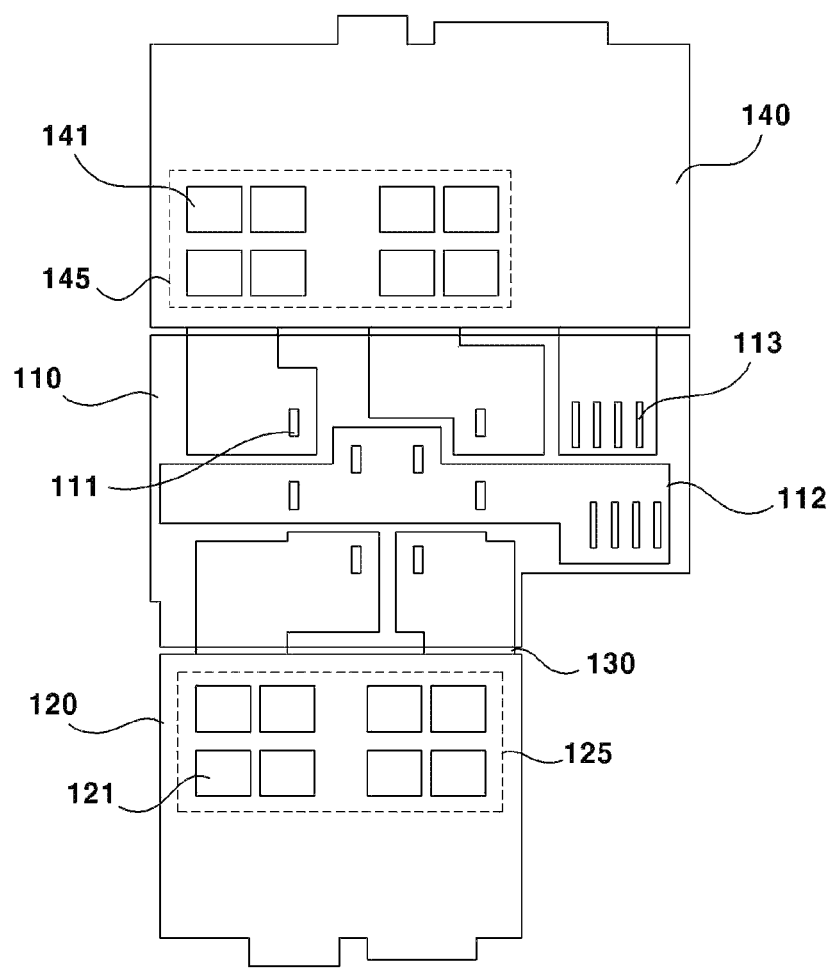
FIGS. 4 and 5 are exploded views of one side and the other side of a substrate module for a transformer according to an embodiment of the present invention.
Figure 5:
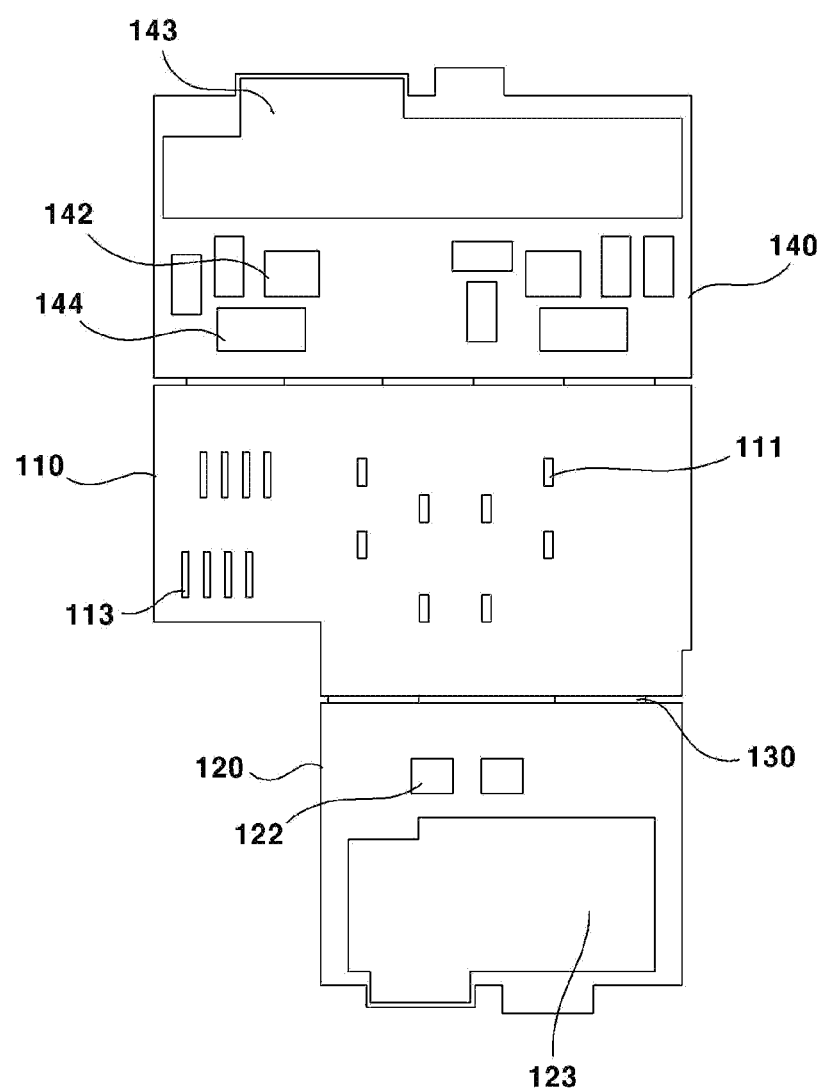

FIGS. 4 and 5 are exploded views of one side and the other side of a substrate module for a transformer according to an embodiment of the present invention. FIG. 4 is an exploded view of a surface corresponding to an outer surface when the substrate module for a transformer according to an embodiment of the present invention is connected to a transformer, and FIG. 5 may be an exploded view of a surface corresponding to the inner surface. Or, it may be a substrate module for a transformer before bending is formed with respect to the first substrate 110 and the second substrates 120 and 140.

In forming the switch modules 125 and 145, as shown in FIGS. 4 and 5, the FET modules 121 and 141 are formed on a first surface of the second substrates 120 and 140, and the control module 122 and 142 may be formed on the second surface of the second substrates 120 and 140. The FET modules 121 and 141 may be formed on the opposite surface of the surface close to the transformer 210 when the transformer substrate module is connected to the transformer 210. That is, it may be formed on an outer surface shown in FIG. 4. The control modules 122 and 142 may be formed on a surface close to the transformer 210 when the transformer substrate module is connected to the transformer 210. That is, it may be formed on an inner surface shown in FIG. 5. Or, the FET modules 121 and 141 may be formed on an inner surface, and the control modules 122 and 142 may be formed on an outer surface, or may be formed on the same surface.

The second substrates 120 and 140 may include heat dissipation parts 123, 143, and 144 for dissipating heat generated by the switch modules 125 and 145 to the outside. Since a lot of heat may be generated in the switch modules 125 and 145, in order to dissipate the heat generated in the switch modules 125 and 145 to the outside, as shown in FIG. 5, heat dissipation parts 123, 143, and 144 may be formed on the second substrates 120 and 140. Some heat dissipation parts 123 and 143 may serve as a busbar connecting the switch modules 125 and 145 with the main substrate, at this time, the heat dissipation parts 123 and 143 may be formed of metal and exposed to the outside to realize not only electrical connection but also the effect of heat dissipation. For more effective heat dissipation, not only the busbar-shaped heat dissipation parts 123 and 143, but also the heat dissipation part 144 may be formed in the form of a metal for heat dissipation. Heat generated by the switch modules 125 and 145 may be discharged to the outside through the heat dissipation parts 123, 143, and 144.

The heat dissipation parts 123, 143, and 144 may be formed on the first surface or the second surface of the second substrates 120 and 140 through which the wind of the heat dissipation fan passes. For effective heat dissipation, the heat dissipation parts 123, 143, and 144 may be formed on the surfaces of the second substrates 120 and 140 so that the wind of the heat dissipation fan passes. When the wind of the heat dissipation fan passes the inner surface of FIG. 5, it may be formed on the inner surfaces (the second surface) of the second substrates 120 and 140, and when the wind of the heat dissipation fan passes the outer surface of FIG. 4, it may be formed on the outer surface (first surface) of the second substrates 120 and 140. Or, it may be included on both surfaces. Or, the heat dissipation part is not formed on the second substrates 120 and 140, but may be formed as a separate heat sink, and all of the heat dissipation parts 123, 143, and 144 formed on the second substrates 120 and 140, and a separate heat sink may also be formed. The heat dissipation parts 123, 143, and 144, or the heat sink may be implemented in various sizes and shapes according to the amount of heat generated.

The conductive connector 130 connects the first substrate 110 and the second substrates 120 and 140.

More specifically, the conductive connector 130 connects the first substrate 110 and the second substrates 120 and 140 and is formed of a conductive material that can be bent. Here, the bending process means a process of bending a plate, light, sealing material, and the like into a desired shape. For ease of operation, the conductive connector 130 is formed to a hardness that can be bent by an operator by hand, and can be bent using a predetermined tool. When the substrate module for a transformer according to an embodiment of the present invention is manufactured, the first substrate 110 and the second substrates 120 and 140 are formed in a flat shape, and when mounted on the transformer 210, it may be bent and deformed into a three-dimensional form by an operator. By mounting the deformed substrate module on the transformer 210 followed by soldering, the substrate module may be coupled to the transformer 210.

The conductive connector 130 may electrically connect the first substrate 110 and the second substrates 120 and 140. The conductive connector 130 may be formed of a conductive material formed inside the first substrate 110 and the second substrates 120 and 140. The conductive connector 130 may be a copper plate formed inside the first substrate 110 and the second substrates 120 and 140. In addition to the copper plate, it may be a conductive material having a bendable hardness. The conductive connector 130 may be formed by forming the first substrate 110 and the second substrates 120 and 140 as one substrate, and then formed by etching the substrate excluding the conductive material to enable bending.

The conductive connector 130 can be bent, and the first substrate 110 and the second substrates 120 and 140 can be connected by forming a predetermined angle through the bending process. The conductive connector 130 may have a hardness that allows bending, and may maintain an angle formed after bending. The conductive connector 130 may form an angle between the first substrate 110 and the second substrates 120 and 140 and electrically connect the first substrate 110 and the second substrates 120 and 140. The conductive connector 130 may be connected to the busbar 112 formed on the first substrate 110 or may be formed integrally. The busbar 112 formed on the first substrate 110 may be electrically connected to the second substrates 120 and 140 through the conductive connector 130. The conductive connector 130 may be connected to the switch modules 125 and 145 of the second substrates 120 and 140. The switch modules 125 and 145 are connected to the power lines of the main substrate through the heat dissipation parts 123 and 143 having a busbar function formed on the second substrates 120 and 140, as shown in FIG. 5, and the power lines of the main substrate, heat dissipation parts 123 and 143 of the second substrates 120 and 140, switch modules 125 and 145, conductive connector 130, busbar 112 of the first substrate, transformer connection part 111, and transformer 210 are electrically connected in order, and the electrical connection may be turned on/off according to the operation of the switch modules 125 and 145.

The conductive connector 130 may be formed to have a thickness, width, and number necessary to maintain the first substrate 110 and the second substrates 120 and 140 at a predetermined angle through bending. In addition, the first substrate 110 and the second substrate 120 and 140 may be formed in a number necessary for electrical connection. In addition, the shape and number of the conductive connectors 130 may vary depending on the design.

The conductive connector 130 may further include a reinforcement part so that the connection part is not cut off. The reinforcing part is flexible so as not to affect bending, but may be formed of a material that does not break. That is, it may be formed of a flexible and rigid material.

The first substrate 110 and the second substrates 120 and 140 may be a metal PCB substrate or a wire-laid PCB substrate. A metal PCB substrate is a substrate that uses a metal such as aluminum that does not conduct electricity, rather than an epoxy resin, as the insulating layer of the PCB substrate. As described above, since the FET modules 121 and 141, which are switching elements, are formed on the second substrates 120 and 140 as surface mount elements, it may be formed of a metal PCB substrate so as to replace the heat sink and perform heat dissipation.

The wire-laid PCB substrate is a PCB substrate on which wiring is formed, and wiring for electrical connection is formed inside the substrate, so that it is possible to remove the connection of the coaxial cable from the outside of the substrate for electrical connection. Through this, the size of the entire module can be reduced, and a large current can flow. In addition, it is advantageous to form a three-dimensional substrate through bending of a wired copper plate. In addition, the metal such as copper plate is wired inside, so the heat conduction is fast and the heat dissipation effect is great.

Figure 6:
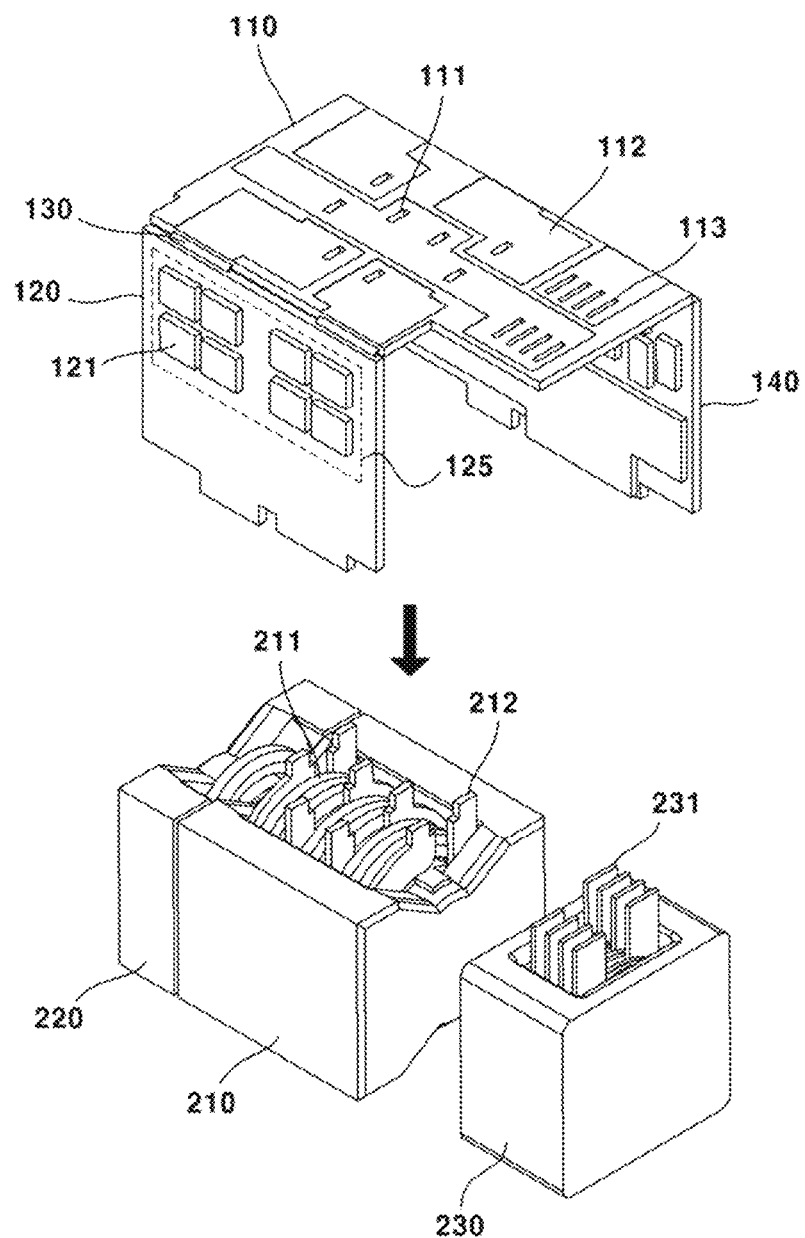
FIG. 6 is a view for explaining a transformer on which a substrate module for a transformer according to an embodiment of the present invention is mounted.

When a substrate module 100 for a transformer is formed of second substrates 120 and 140 having all of a first substrate 110, a first-second substrate 120, and a second-second substrate 140, the first substrate 110 is located on an upper surface of the transformer 210 so as to be mounted on the transformer 210 and one end of each of the plurality of substrates forming the second substrates 120 and 140 is connected to form a predetermined angle on both side surfaces of the first substrate 110, and the other end may be formed to be connected to the main substrate located on a lower surface of the transformer 210. As shown in FIG. 6, the transformer 210 includes a primary coil 211 and a secondary coil 212, and a primary-side inductor 220 and a secondary-side inductor 230 may be additionally disposed. The primary coil 211 and the secondary coil 212 are insulated from each other, and may be formed to cross each other as shown in FIG. 6. The primary side inductor 220 and the primary coil 211 may be connected to the main substrate, and the secondary coil 212 and the secondary-side inductor 230 may be respectively connected to the transformer connection part 111 and the inductor connection part 113 of the first substrate 110. When the connection terminal of the transformer 210 is formed in an upper portion, the first substrate 110 on which the transformer connection part 111 is formed so that the connection terminals of the transformer 210 and the transformer connection part 111 are connected is located on an upper surface of the transformer 210; the second substrates 120 and 140 include switch modules 125 and 145, but in order to electrically connect the first substrate 110 and the main substrate, each of the second substrates 120 and 140 is connected to both sides of the first substrate 110, and the other end is connected to the main substrate. The second substrates 120 and 140 may serve not only to be electrically connected to the first substrate 110 and the main substrate, but also to support the first substrate 110 on an upper portion of the transformer 210. When the second substrates 120 and 140 are formed of either the first-second substrate 120 or the second-second substrate 140, a support is formed on the other surface of the first substrate 110 to which the second substrate 120 or 140 is not connected in a way that the first substrate 110 can be supported on an upper portion of the transformer 210.

Figure 7:
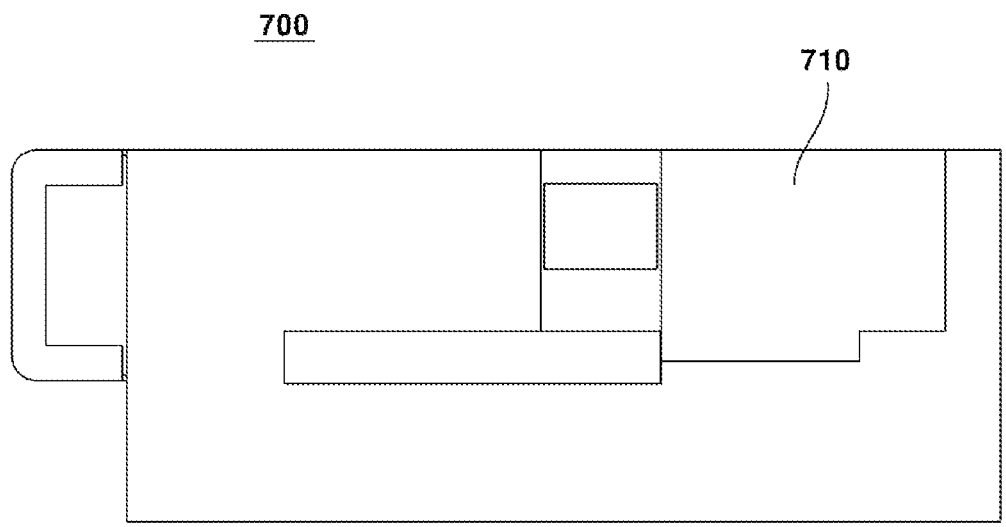
FIG. 7 illustrates a power module including a substrate module for a transformer according to an embodiment of the present invention.

FIG. 7 illustrates a power module 700 including a substrate module 710 for a transformer according to an embodiment of the present invention, wherein: the power module 700 is connected to the transformer 210 and the primary coil 211 or the secondary coil 212 of the transformer 210 to input or output a voltage or current; a substrate module 710 including switch modules 125 and 145 for controlling the input and output of the voltage or current is included; the substrate module 710 includes a first substrate 110 on which a transformer connection part 111 connected to a terminal of the transformer 210 is formed, and one or more of second substrates 120 and 140 on which switch modules 125 and 145 for controlling the transformer 210 are formed; and the first substrate 110 and the second substrates 120 and 140 are connected to each other at a predetermined angle by a bendable conductive connector 130. In addition, other parts for supplying power such as a switch for controlling the primary coil 211 of the transformer 210, a power factor correction (PFC) device, and the like, are formed so that it can be manufactured as one module for supplying power. The power module may be used as a power supply unit (PSU) for a data center. In addition, it can be used for various devices.

Figure 8:
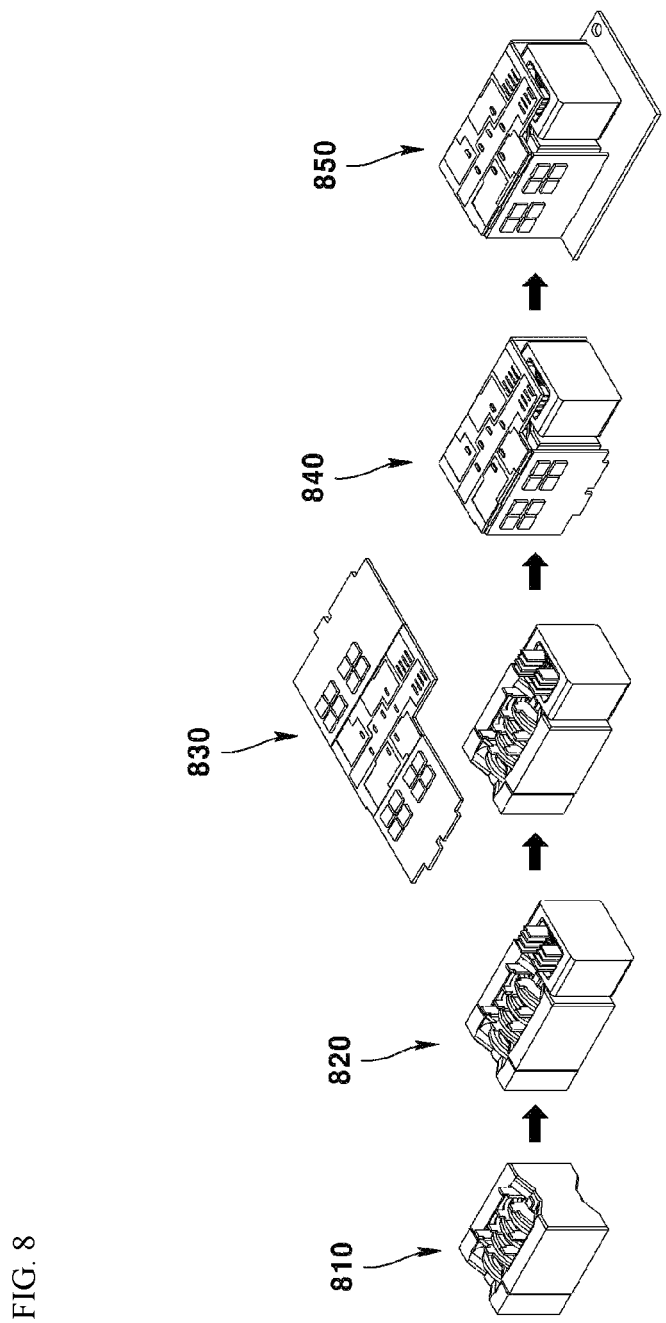
FIG. 8 is a view for explaining a process of mounting a substrate module for a transformer to a transformer according to an embodiment of the present invention.

FIG. 8 is a view for explaining a process of mounting a substrate module for a transformer to a transformer according to an embodiment of the present invention. First, a transformer formed of a primary coil and a secondary coil is set (810), and a secondary-side inductor is set in the transformer (820). After setting the substrate module for the transformer on the transformer (830), the substrate module is bended by applying bending processing to the substrate module for transformer, the substrate module is mounted on the transformer (840), and the terminals of the transformer and the transformer connection part are soldered (850). As shown in FIG. 8, when it is formed of 8 transformer terminals and 8 secondary-side inductor terminals, soldering is performed at 16 points. Then, the transformer substrate module is set on the main substrate and the connection points are soldered. At this time, soldering can be performed at 18 points. When connecting a transformer or an inductor using a plurality of separate busbars other than the busbar and transformer connection part formed on the first substrate, a specific jig is required for assembling, and since there are many points to perform soldering that makes the work difficult, and therefore it must be performed by an experienced technician, however, when using the substrate module for a transformer according to an embodiment of the present invention, even ordinary workers can work because the process is simple. In addition, if the busbar of the first substrate is not used, when connecting the terminal of the inductor to the main substrate, a connection line must be formed separately from the substrate, thereby requiring a separate space for this. However, when using the substrate module for a transformer according to an embodiment of the present invention, electrical connection to the main substrate of the secondary-side inductor can be implemented through the busbar of the first substrate, a separate connection line for the inductor is unnecessary, thereby facilitating the use of space. In addition, it is possible to reduce the contact resistance by reducing the number of soldering processes by using a busbar, and it is possible to reduce the parasitic resistance including the contact resistance in a high current device, thereby increasing the submission efficiency.

The positions of the first substrate 110 and the second substrates 120 and 140 may vary depending on a state in which the transformer 210 is mounted on the main substrate.

Figure 9:
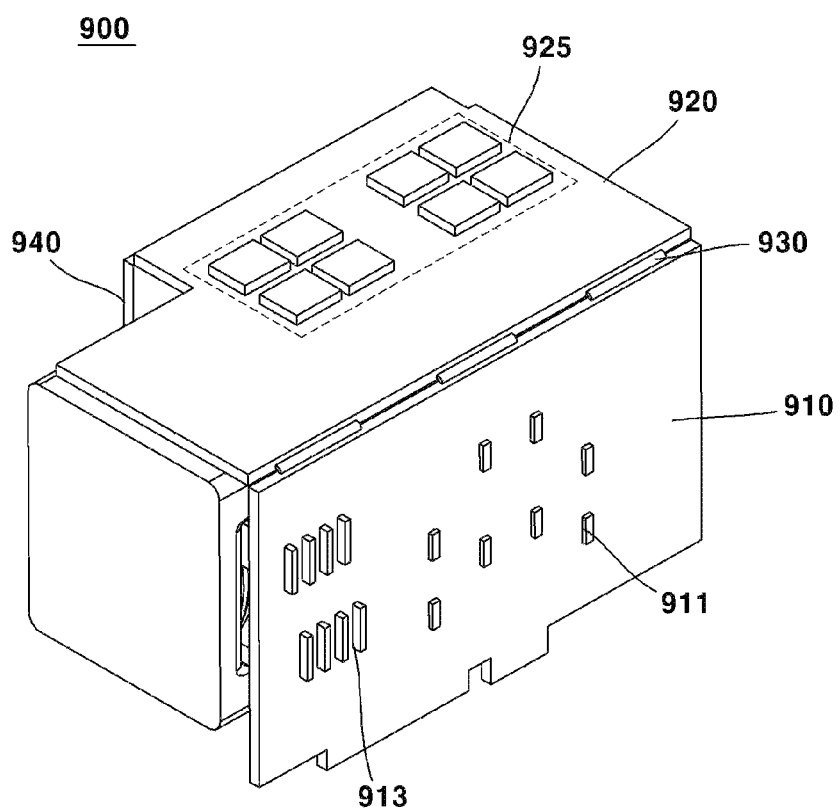
FIG. 9 is a perspective view of a substrate module for a transformer according to a second embodiment of the present invention.

FIG. 9 is a perspective view of a substrate module 900 for a transformer according to a second embodiment of the present invention.

Unlike the transformer 210 of FIG. 6 in which the terminal of the transformer 210 faces upper portion, the transformer 210 may be formed so that the terminals of the transformer 210 face to the side surface, as shown in FIG. 9. In this case, the first substrate 910 on which the transformer connection part 911 is formed is also formed on a side surface, as shown in FIG. 9, and one end of the second substrates 920 and 940 may be connected to the other surface of which the first substrate 910 is not connected to the main substrate through the conductive connector 930. The second substrates 920 and 940 may be formed of a second-first substrate 920 and a second-second substrate 940, and the second-first substrate 920 and the second-second substrate 940 may be connected to each other through a conductive connector 930. The configuration of the first substrate 910 and the second substrates 920 and 940 is only different from the position and connection relationship connected to the first substrate 110 and the second substrate 120 and 140 of FIGS. 1 to 8, and since detailed configurations and descriptions thereof correspond to each other, overlapping descriptions will be omitted.

Figure 10:
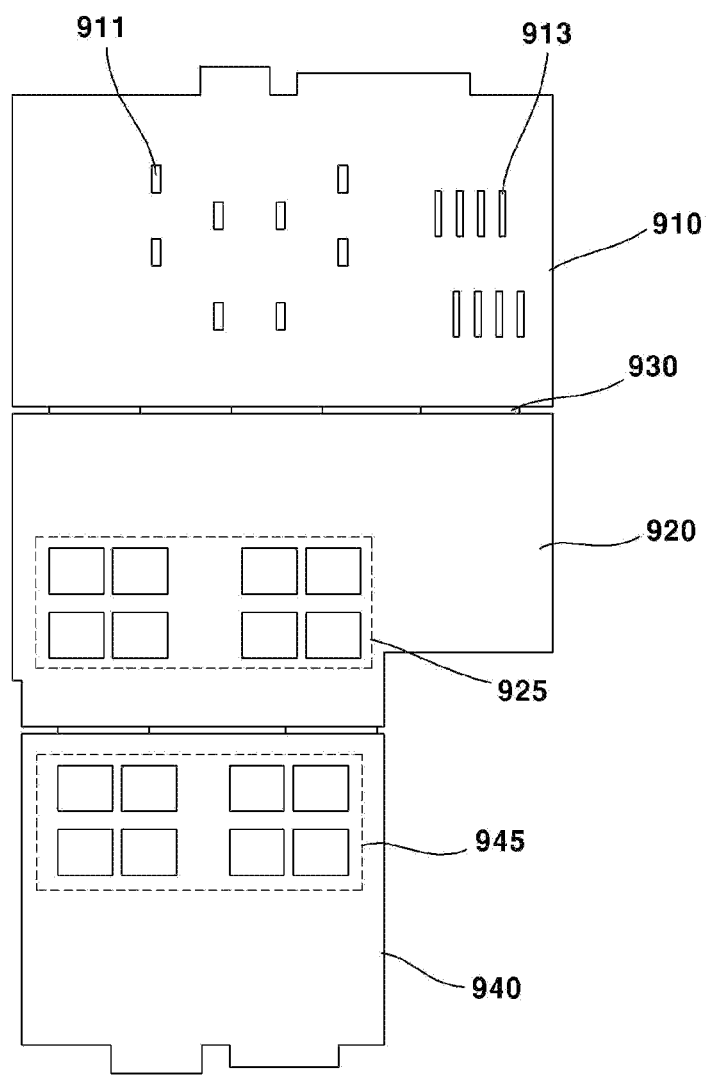
FIGS. 10 and 11 are views for explaining a substrate module for a transformer according to a second embodiment of the present invention.
Figure 11:
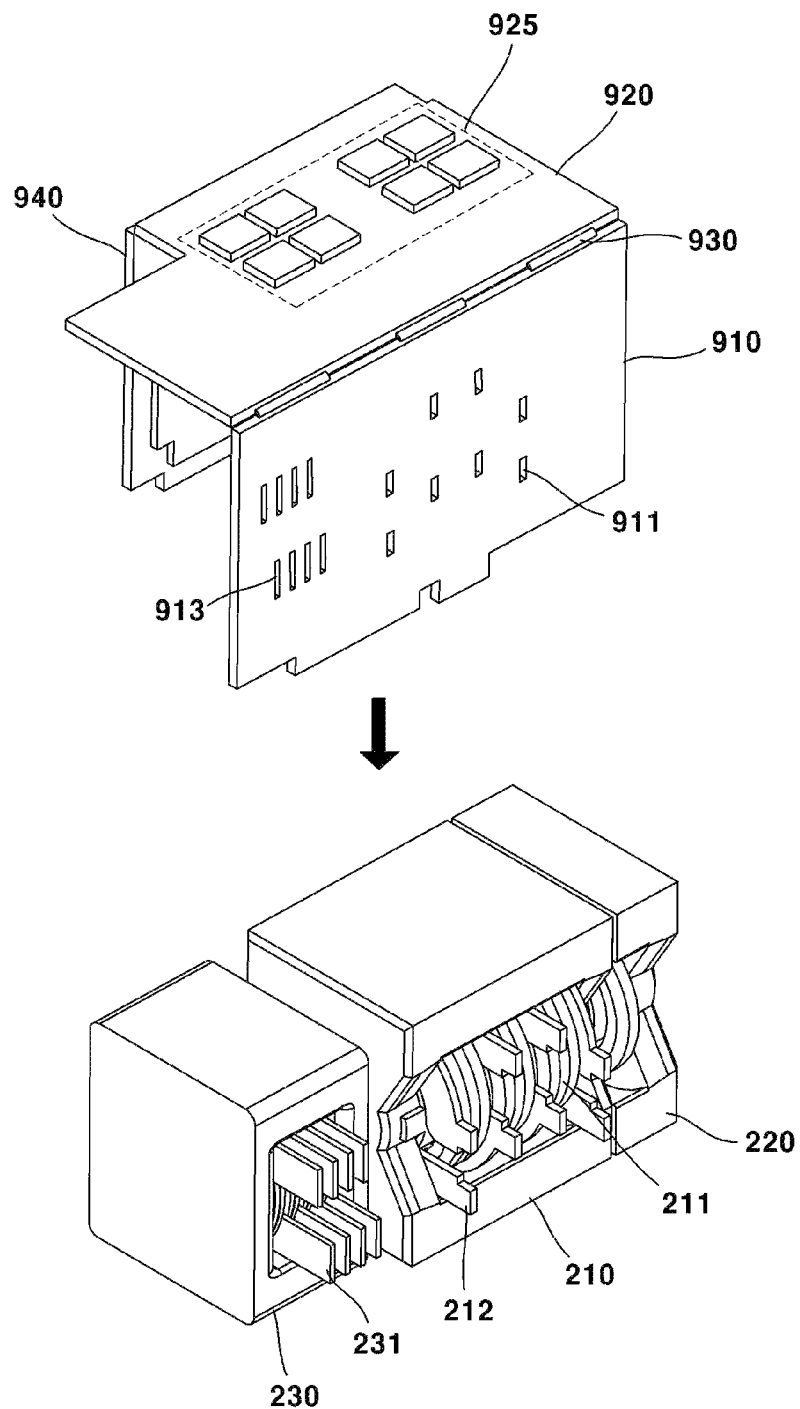

A transformer connection part 911 and an inductor connection part 913 are formed on the first substrate 910, and may be connected to the second substrates 920 and 940 at a predetermined angle through the conductive connector 930. Switch modules 925 and 945 may be formed on the second substrates 920 and 940. In the case of the form as shown in FIG. 9, as shown in FIG. 10, the first substrate 910, second-first substrate 920, and second-second substrate 940 are connected in order, and each substrate is formed at a predetermined angle as shown in FIG. 11 and mounted on a transformer 210 in which terminals are formed laterally. The transformer 210 may be formed in any direction other than the direction shown in FIG. 11. In addition, the transformer connection terminals and the inductor connection terminals may be formed in different directions, and accordingly, the transformer connection part and the inductor connection part may be formed on different substrates. As described above, since the positions of the first substrate and the second substrate can be formed differently depending on the shape of the transformer 210, the position and direction of the transformer 210 can be freely designed, thereby increasing the degree of freedom in design.

Figure 12:
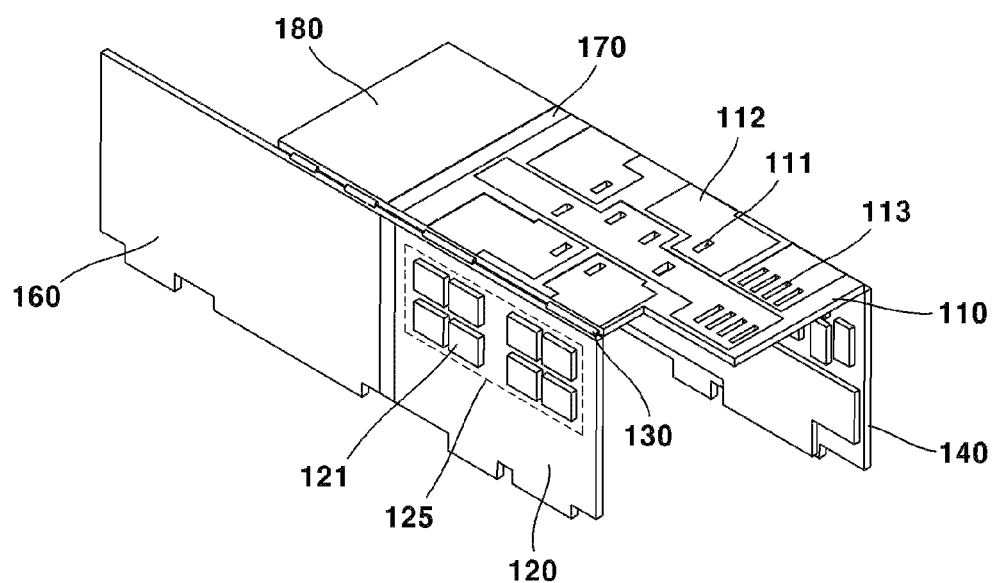
FIGS. 12 and 13 are perspective views of a substrate module for a transformer according to a third embodiment of the present invention.
Figure 13:
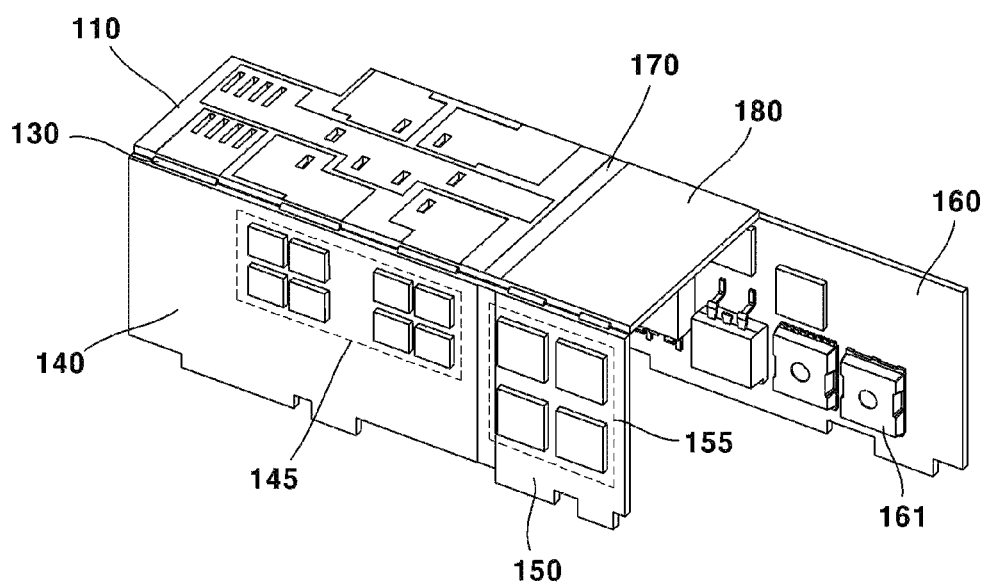
Figure 14:
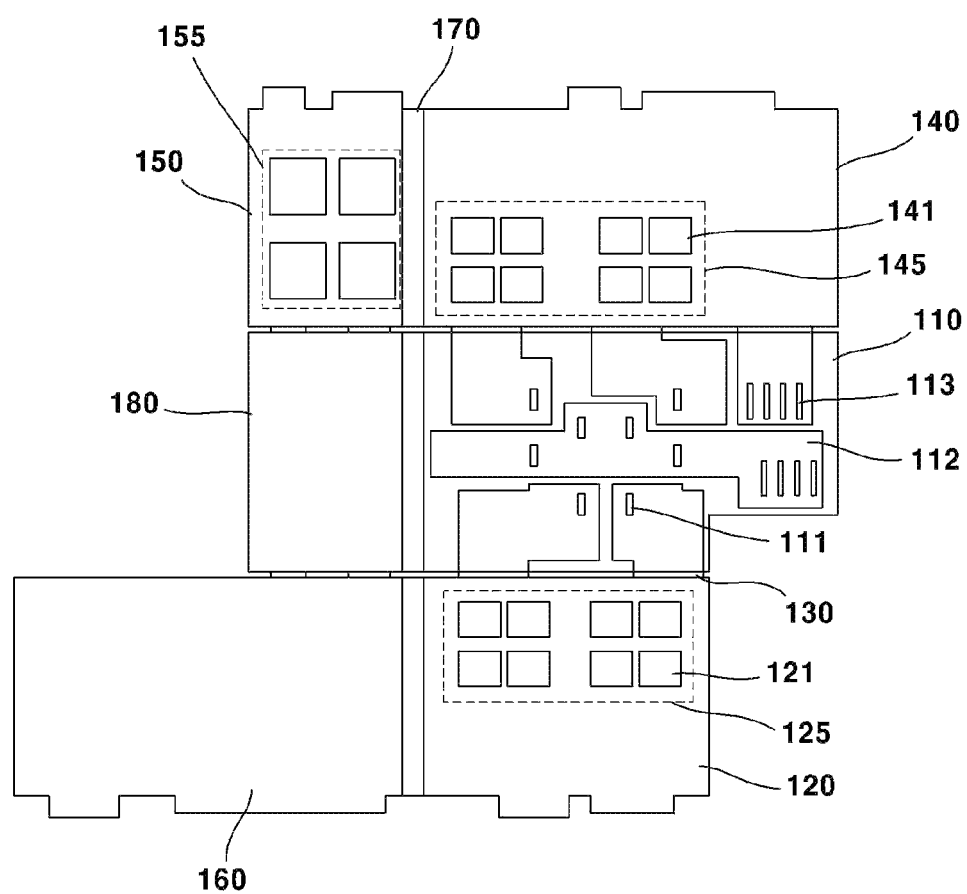
FIGS. 14 and 15 are exploded views of one surface and the other surface of a substrate module for a transformer according to a third embodiment of the present invention.
Figure 15:
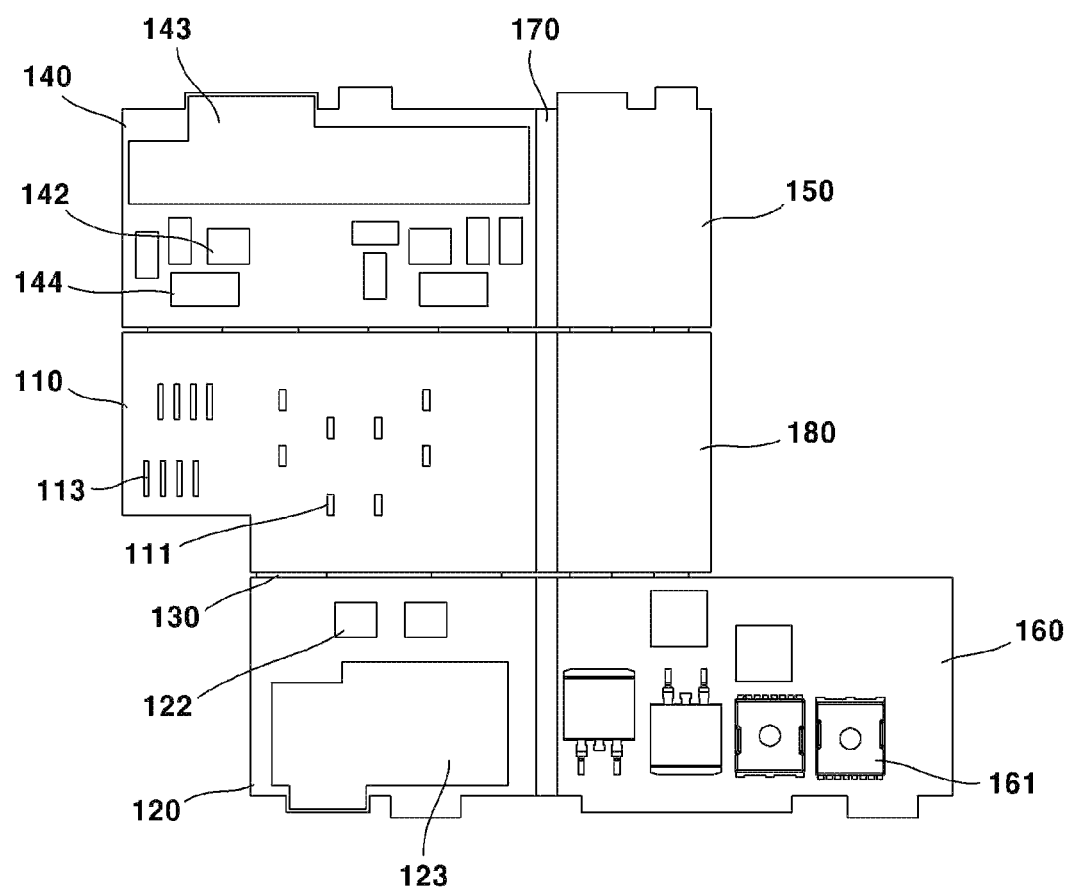

FIGS. 12 and 13 are perspective views of a substrate module for a transformer according to a third embodiment of the present invention; and FIGS. 14 and 15 are exploded views of one surface and the other surface of a substrate module for a transformer according to a third embodiment of the present invention.

Not only the switch modules 125 and 145 being connected to the secondary coil 212 of the transformer 210, but also a switch module 155 being connected to the primary coil 211 of the transformer 210 may be formed in the substrate module 1200 for a transformer. To this end, a third substrate 150 may be further included. In addition, a fourth substrate 160 forming the power factor correction unit may be included, and in addition, a plurality of substrates capable of forming other components in a surface mount form may be further included.

The third substrate 150 can be formed with a switch module 155 being connected to the primary coil 211 of the transformer 210. The third substrate 150 may be formed to be extended in one direction of the substrate module 1200 for a transformer. The switch module 155 of the third substrate 150 may be a PSFB primary-side switch module. Like the second substrates 120 and 140, the third substrate 150 may include an FET module and a control module, and may include a heat dissipation part. Since the primary coil 211 and the secondary coil 212 must be insulated from each other, the third substrate 150 may be formed to be insulated from the first substrate 110 or the second substrates 120 and 140 physically or electrically being connected to the secondary coil 212. To this end, an insulating layer 170 may be formed. When the transformer 210 is formed in three or more orders, the switch modules of each order are formed on one substrate, and each substrate may be formed to be insulated. By forming devices of the same order on one substrate, the degree of integration and processability can be improved by modularizing through integration.

A power factor compensator 161 may be formed on the fourth substrate 160. The fourth substrate 160 may be formed to be extended in the same direction as the third substrate 150. When the second substrates 120 and 140 are formed of the first-second substrate 120 and the second-second substrate 140, the third substrate 150 and the fourth substrate 160 may be formed by being connected to different substrates, respectively. That is, the third substrate 150 may be formed by being connected to the second-second substrate 140, and the fourth substrate 160 may be formed by being connected to the first-second substrate 120. A power factor compensator 161 is formed on the fourth substrate 160. The power factor compensator (PFC) 161 compensates for a power factor according to inductance or capacitance characteristics of internal devices. Since a lagging power factor is generated by a device operating as an inductance load, and a leading power factor is generated when operating as a capacitive load, thereby compensating the generated power factor to increase stability. Since a lot of heat may be generated in the power factor compensator 161, heat dissipation is performed by a heat sink, and the power factor compensator 161 can be modularized without a heat sink by forming the power factor compensator 161 on the fourth substrate 160 in the form of a surface mount device. This reduces the number of points that need to be soldered to the heat sink, reducing the man-hours. In addition, it is possible to prevent the heat sink from obstructing the air flow of the heat dissipation fan, thereby improving the heat dissipation efficiency. The power factor compensator 161 may be formed on a first surface of the fourth substrate 160 through which the wind of the heat dissipation fan passes. When the wind of the heat dissipation fan passes through an inner surface of FIG. 15, the power factor compensator 161 may be formed on the inner surface. Or, it may be formed on an outer surface. In addition, a heat dissipation part for heat dissipation of the power factor compensator 161 may be formed on the fourth substrate 160. Like the third substrate 150, the fourth substrate 160 may be insulated from the first substrate 110 to the second substrates 120 and 140 and the insulation layer 170.

In addition to the third substrate 150 or the fourth substrate 160, a fifth substrate 180 may be included as shown in FIGS. 12 to 15. The fifth substrate 180 may connect the third substrate 150 and the fourth substrate 160 to each other, and may form an electrical connection or physical support of the third substrate 150 and the fourth substrate 160. In addition, other devices may be formed in a surface mount form.

The fifth substrate 180 may form a path together with the third substrate 150 and the fourth substrate 160, along the path formed in this way, a path in which the wind of the heat dissipation fan moves may be formed, and through this, the effect of heat dissipation can be increased. A heat dissipation part of each substrate or elements generating a lot of heat may be disposed in the path when the wind of the heat dissipation fan moves through the path.

Figure 16:
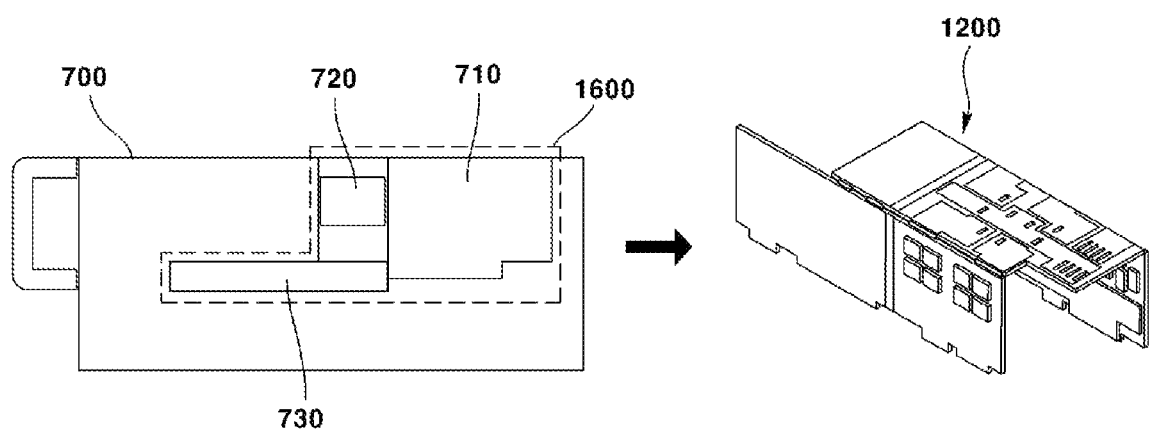
FIG. 16 is a view for explaining the application of a substrate module for a transformer to a power module according to a third embodiment of the present invention.

By forming the third substrate 150 and the fourth substrate 160, as shown in FIG. 16, the substrate module 710 for a transformer, the transformer primary side switch 720, and the components 1600 consisting of the power factor compensator 730 can be formed as one substrate module 1200, and thus the space can be reduced, thereby increasing the degree of integration and thus increasing the scalability of space utilization.

As described above, in the present invention, specific matters such as specific components, and the like; and limited embodiments and drawings have been described, but these are only provided to help a more general understanding of the present invention, and the present invention is not limited to the above embodiments, and various modifications and variations are possible from these descriptions by those of ordinary skill in the art to which the present invention belongs.

Therefore, the spirit of the present invention should not be limited to the described embodiments, and not only the claims to be described later, but also all those with equivalent or equivalent modifications to the claims will be said to belong to the scope of the spirit of the present invention.

The invention claimed is:

1. A substrate module comprising:
a first substrate comprising a transformer connection part connected to terminals of a transformer;
at least one second substrate including a switch module connected to the transformer; and
a conductive connection plate for connecting the first substrate and the at least one second substrate to each other, the conductive connection plate having a bend,
wherein the first substrate and the at least one second substrate are connected to each other by the conductive connection plate at a predetermined angle formed therebetween, the predetermined angle corresponding to an angle of the bend,
wherein the first substrate is located on an upper surface of the transformer,
wherein the at least one second substrate comprises a first-second substrate and a second-second substrate spaced apart from the first-second substrate, and
wherein the-first-second substrate and the second-second substrate are each connected at a first end forming the predetermined angle on opposite sides of the first substrate, and a second end of each is connected to a main substrate located on a lower surface of the transformer.

2. The substrate module according to claim 1, wherein the transformer connection part is connected to terminals of a secondary coil of the transformer.

3. The substrate module according to claim 1, wherein the first substrate comprises an inductor connection part connected to terminals of a secondary-side inductor disposed on one side of the transformer.

4. The substrate module according to claim 3, wherein the transformer connection part is formed of a plurality of holes connected to a plurality of terminals of the transformer, and the inductor connection part is formed of a plurality of holes connected to the terminals of the secondary-side inductor.

5. The substrate module according to claim 4, wherein the first substrate comprises a busbar for connecting the transformer connection part and the conductive connection plate, and the inductor connection part and the conductive connection plate.

6. The substrate module according to claim 5, wherein the busbar comprises a first busbar connected to terminals of a first coil of the transformer and a second busbar connected to terminals of a secondary coil of the transformer.

7. The substrate module according to claim 6, wherein the first busbar is spaced apart from the second busbar.

8. The substrate module according to claim 1, wherein the switch module comprises a plurality of FET modules disposed on a first surface of the at least one second substrate and a control module disposed on a second surface of the at least one second substrate to control the plurality of FET modules.

9. The substrate module according to claim 8, wherein a heat dissipation part for dissipating heat generated at the switch module to outside is disposed on the second surface of the at least one second substrate.

10. The substrate module according to claim 1, comprising:
a third substrate on which a switch module connected to a primary coil of the transformer is formed,
wherein the third substrate is connected to the at least one second substrate.

11. The substrate module according to claim 1, wherein the first substrate comprises an inductor connection part connected to terminals of a secondary-side inductor disposed on one side of the transformer.

12. A power module comprising:
a transformer; and
a substrate module comprising a switch module connected to a primary coil or a secondary coil of the transformer to input or to receive voltage or current, and to control input and output of the voltage or the current,
wherein the substrate module comprises:
a first substrate on which a transformer connection part connected to terminals of the transformer is formed; and
at least one second substrate on which the switch module for controlling the transformer is formed, and
wherein the first substrate and the at least one second substrate are connected by a conductive connection plate having a bend at a predetermined angle,
wherein the first substrate is located on an upper surface of the transformer,
wherein the at least one second substrate comprises a first-second substrate and a second-second substrate spaced apart from the first-second substrate, and
wherein the first-second substrate and the second-second substrate are each connected at a first end forming the predetermined angle on opposite sides of the first substrate, and a second end of each is connected to a main substrate located on a lower surface of the transformer.

13. The power module according to claim 12, wherein the first substrate comprises an inductor connection part connected to terminals of a secondary-side inductor disposed on one side of the transformer.

14. The power module according to claim 13, wherein the first substrate comprises a busbar for connecting the transformer connection part and the conductive connection plate, and the inductor connection part and the conductive connection plate.

15. The power module according to claim 12, wherein the switch module comprises a plurality of FET modules disposed on a first surface of the at least one second substrate and a control module disposed on a second surface of the at least one second substrate to control the plurality of FET modules.

* * * * *